(12) United States Patent
Hsiao et al.

(10) Patent No.: US 12,557,319 B2
(45) Date of Patent: Feb. 17, 2026

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Hsu Ming Hsiao, Hsinchu (TW); Hsiu-Hao Tsao, Taichung (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 450 days.

(21) Appl. No.: 18/104,927

(22) Filed: Feb. 2, 2023

(65) Prior Publication Data

US 2024/0266424 A1    Aug. 8, 2024

(51) Int. Cl.
*H10D 30/43* (2025.01)
*H10D 30/01* (2025.01)
*H10D 30/67* (2025.01)
*H10D 62/10* (2025.01)
*H10D 64/01* (2025.01)

(52) U.S. Cl.
CPC .......... *H10D 30/43* (2025.01); *H10D 30/014* (2025.01); *H10D 30/6735* (2025.01); *H10D 62/121* (2025.01); *H10D 64/017* (2025.01)

(58) Field of Classification Search
CPC .. H10D 30/43; H10D 30/014; H10D 30/6735; H10D 62/121; H10D 64/017; H10D 30/6757; H10D 30/797; H10D 62/151; H10D 62/822
See application file for complete search history.

(56) References Cited

U.S. PATENT DOCUMENTS

| 10,008,603 | B2 | 6/2018 | Wei et al. |
| 2021/0249271 | A1 | 8/2021 | Peng et al. |
| 2022/0209023 | A1 | 6/2022 | Chang et al. |
| 2022/0230922 | A1* | 7/2022 | Chen .................. H10D 30/6735 |
| 2023/0118088 | A1 | 4/2023 | Lai |

* cited by examiner

*Primary Examiner* — Mohammad A Rahman
(74) *Attorney, Agent, or Firm* — NZ Carr Law Office

(57) ABSTRACT

A semiconductor device, along with methods of forming such, are described. The device includes a semiconductor material disposed over a substrate, a first epitaxial source/drain region in contact with a first end of the semiconductor material, a second epitaxial source/drain region in contact with a second end opposite the first end of the semiconductor material, a first dummy gate dielectric layer in contact with the semiconductor material and the first epitaxial source/drain region, a second dummy gate dielectric layer in contact with the semiconductor material and the second epitaxial source/drain region, and an interfacial dielectric disposed between the first and second dummy gate dielectric layers.

20 Claims, 16 Drawing Sheets

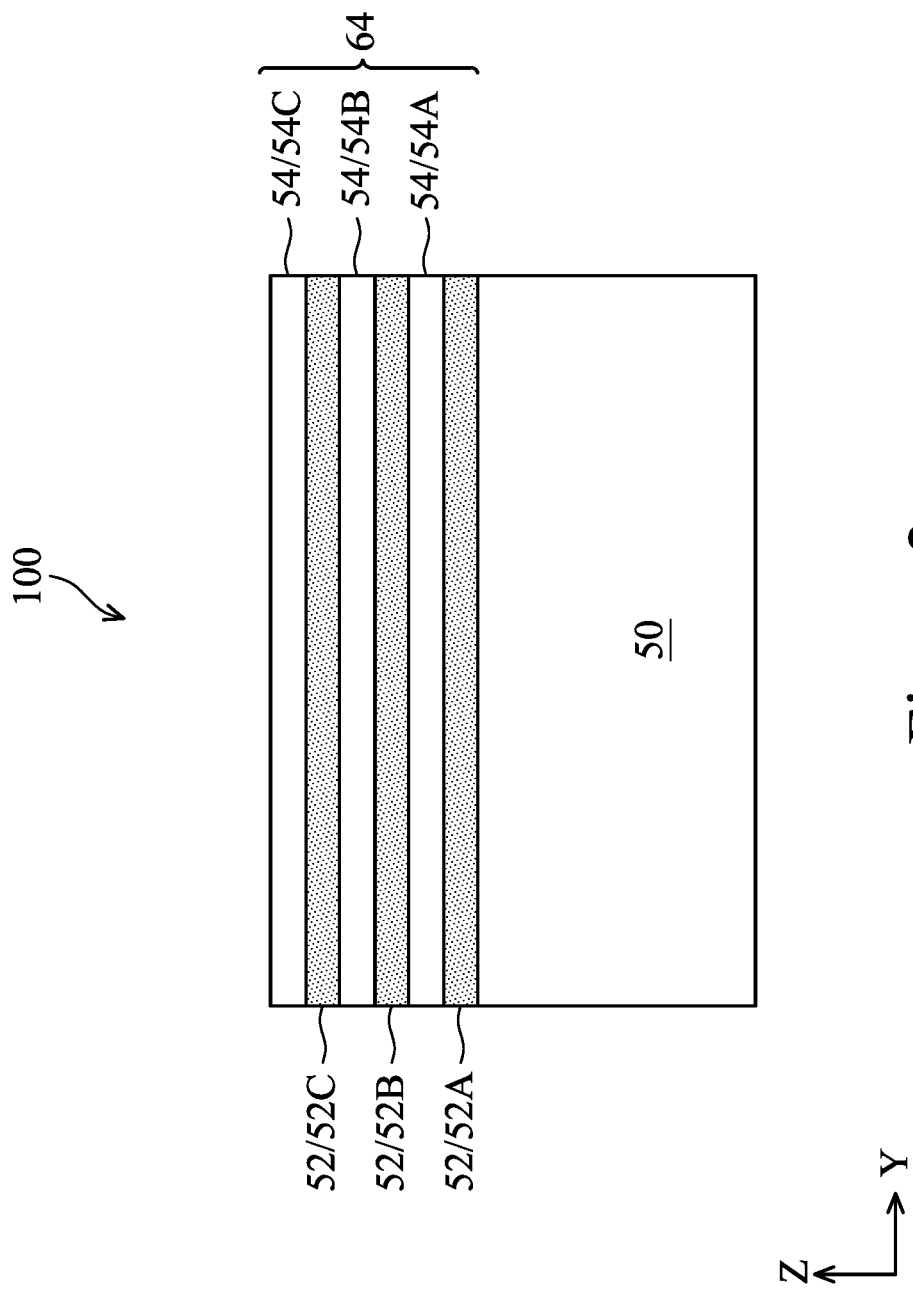

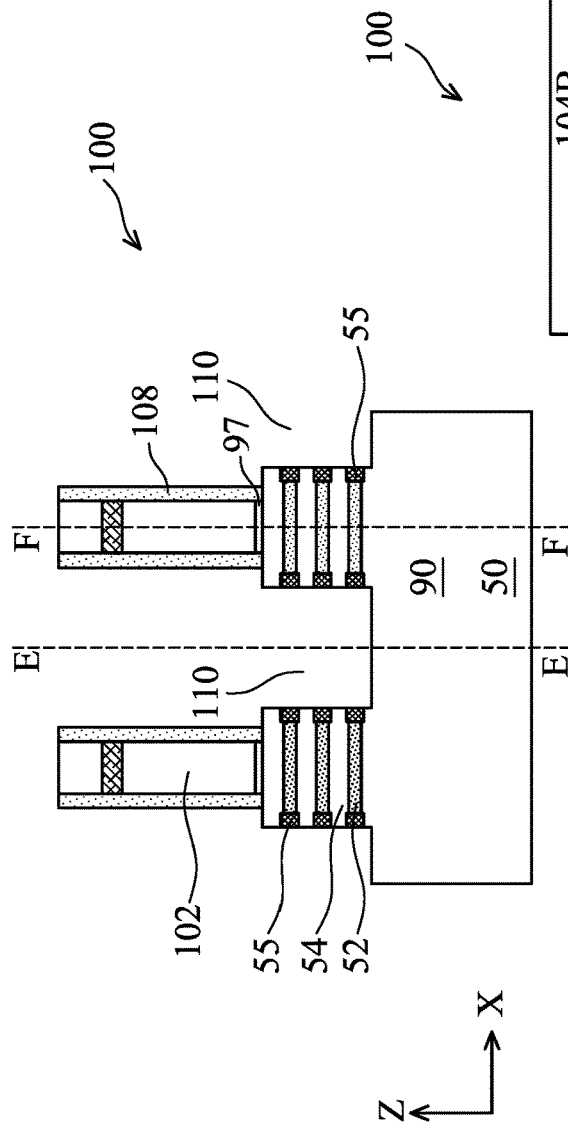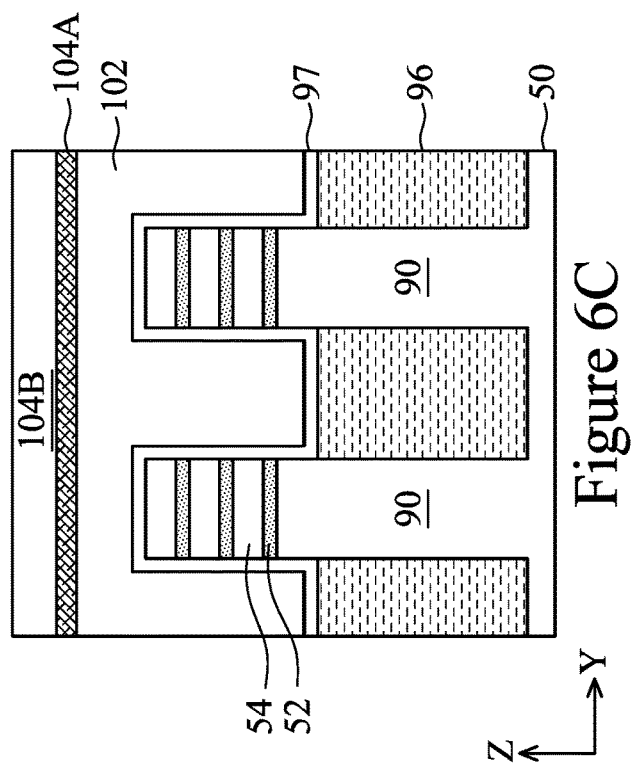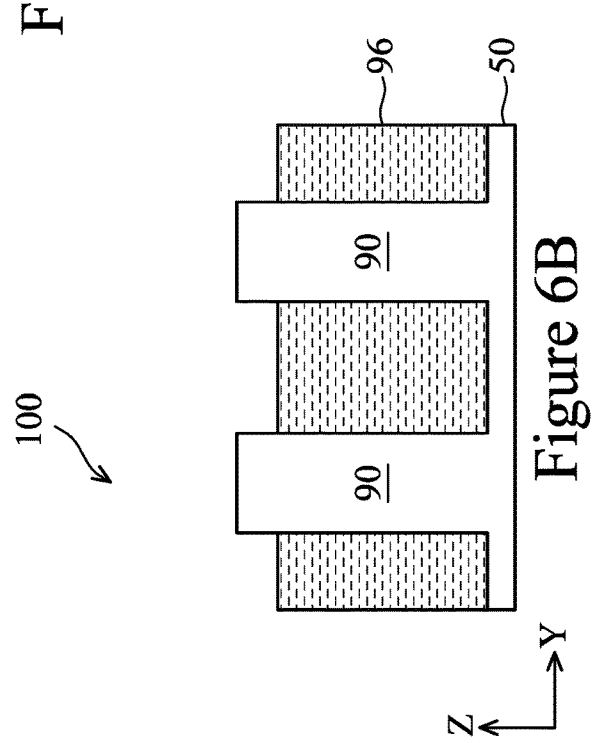
Figure 6A
Figure 6B
Figure 6C

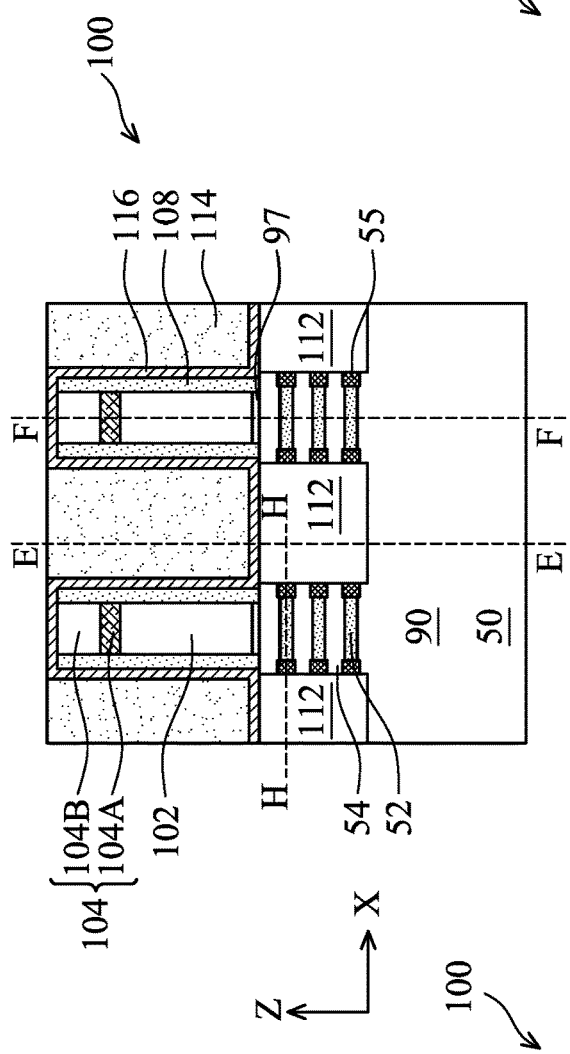
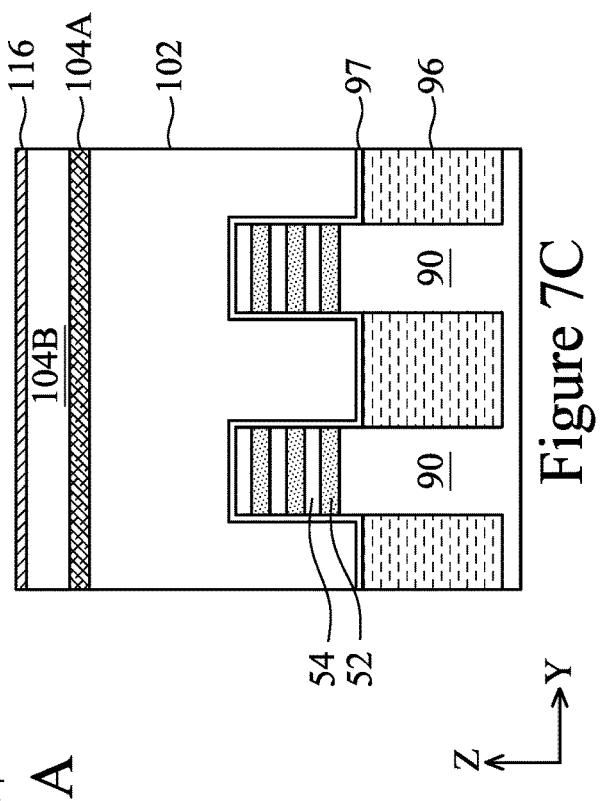
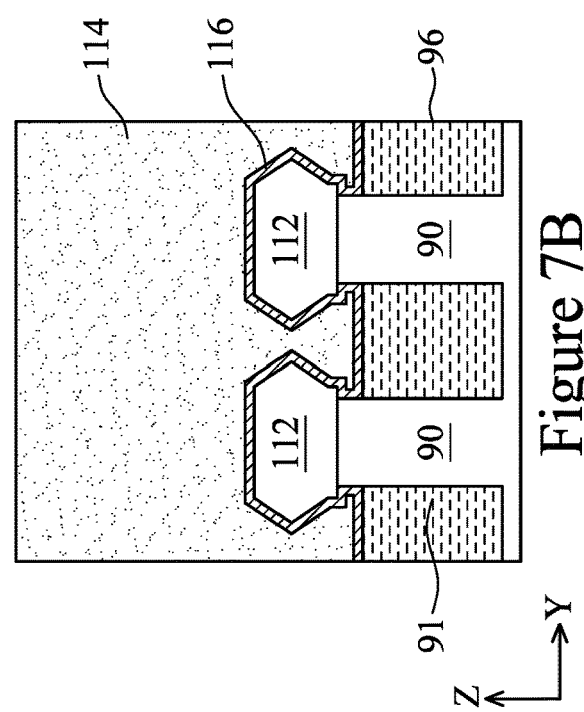
Figure 7A
Figure 7C
Figure 7B

SEMICONDUCTOR DEVICE STRUCTURE AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-11C are cross-sectional views of a nanostructure field-effect transistor device at various stages of manufacturing, in accordance with some embodiments.

DETAILED DESCRIPTION

Figure 1:
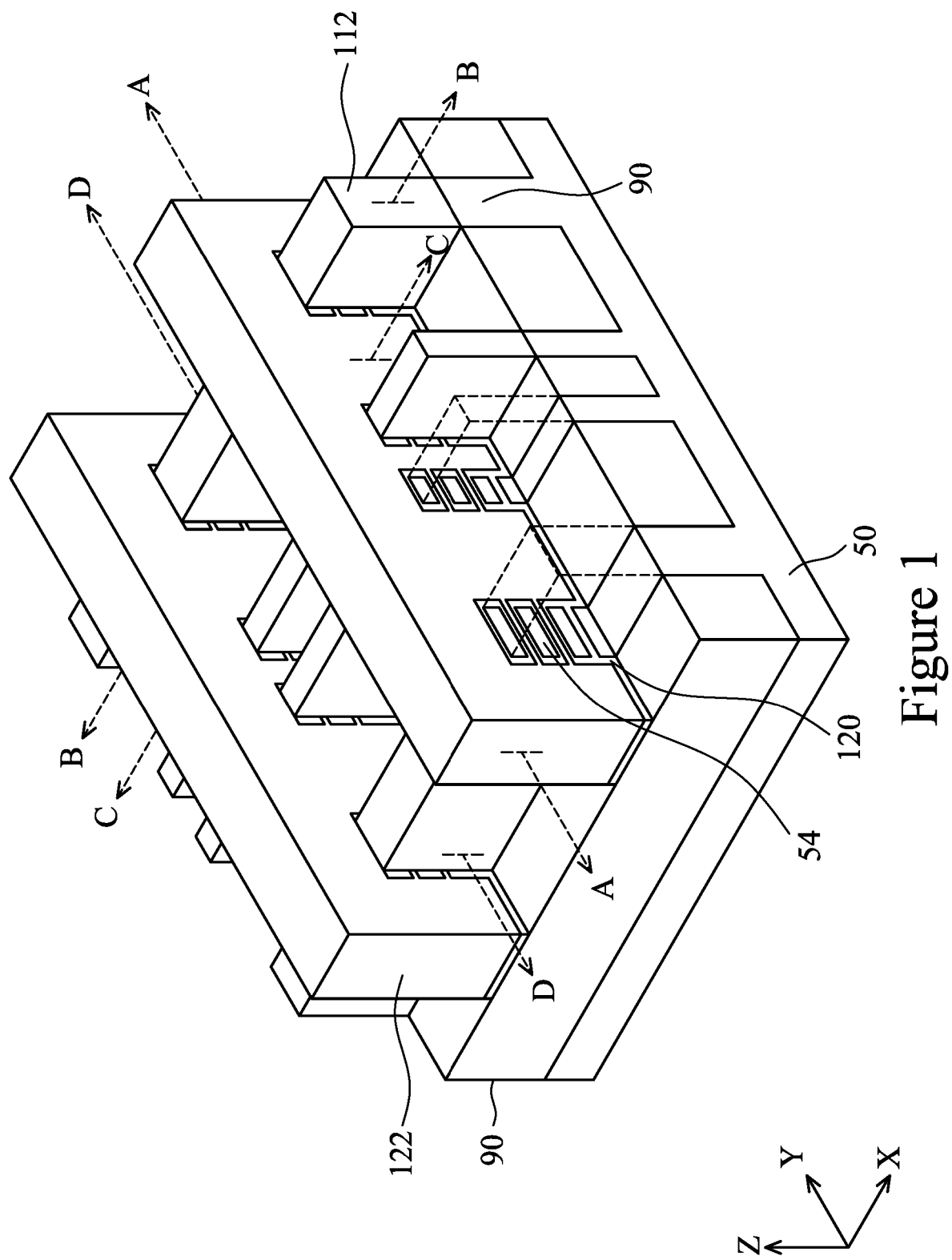
FIG. 1 illustrates an example of a nanostructure field-effect transistor (NSFET) device in a three-dimensional view, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates an example of a nanostructure field-effect transistor (NSFET) device in a three-dimensional view, in accordance with some embodiments. The NSFET device includes semiconductor fins (also referred to as fins) protruding above a substrate 50, where each semiconductor fin includes a semiconductor strip 90 and nanostructures 54 overlying the semiconductor strips 90. A gate electrode 122 (e.g., a metal gate) is disposed over the fins, and source/drain regions 112 are formed on opposing sides of the gate electrode 122. The nanostructures 54 are disposed over the semiconductor strips 90 and between source/drain regions 112. Isolation regions 96 are formed on opposing sides of the fins. A gate dielectric layer 120 is formed around the nanostructures 54. Gate electrodes 122 are over and around the gate dielectric layer 120.

FIG. 1 further illustrates reference cross-sections that are used in later figures. Cross-section A-A is along a longitudinal axis of a gate electrode 122 and in a direction, for example, perpendicular to the direction of current flow between the source/drain regions 112 of a NSFET device. Cross-section B-B is perpendicular to cross-section A-A and is along a longitudinal axis of a fin and in a direction of, for example, a current flow between the source/drain regions 112 of the NSFET device. Cross-section C-C is parallel to cross-section B-B and between two neighboring fins. Cross-section D-D is parallel to cross-section A-A and extends through source/drain regions 112 of the NSFET device. Subsequent figures refer to these reference cross-sections for clarity.

FIGS. 2, 3A, 3B, 4A, 4B, 5A-5D, 6A-6C, 7A-7D, 8A, 8B, 9A-9D, 10A, 10B, and 11A-11C are cross-sectional views of a nanostructure field-effect transistor (NSFET) device 100 at various stages of manufacturing, in accordance with at least one embodiment.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof A multi-layer stack 64 is formed on the substrate 50. The multi-layer stack 64 includes alternating layers of a first semiconductor material 52 and a second semiconductor material 54. In FIG. 2, layers formed by the first semiconductor material 52 are labeled as 52A, 52B, and 52C, and layers formed by the second semiconductor material 54 are labeled as 54A, 54B, and 54C. The number of layers formed by the first and the semiconductor materials illustrated in FIG. 2 are merely non-limiting examples. Other numbers of layers are also possible and are fully intended to be included within the scope of the present disclosure.

In some embodiments, the first semiconductor material 52 is an epitaxial material appropriate for forming channel regions of p-type FETs, such as silicon germanium ($Si_xGe_{1-}$ x, where x can be in the range of 0 to 1), and the second semiconductor material 54 is an epitaxial material appropriate for forming channel regions of n-type FETs, such as silicon. The multi-layer stacks 64 (which may also be referred to as an epitaxial material stack) will be patterned to form channel regions of an NSFET in subsequent processing. In particular, the multi-layer stacks 64 will be patterned and etched to form horizontal nanostructures (e.g., nanosheets or nanowires), with the channel regions of the resulting NSFET including multiple horizontal nanostructures.

Figure 7D:
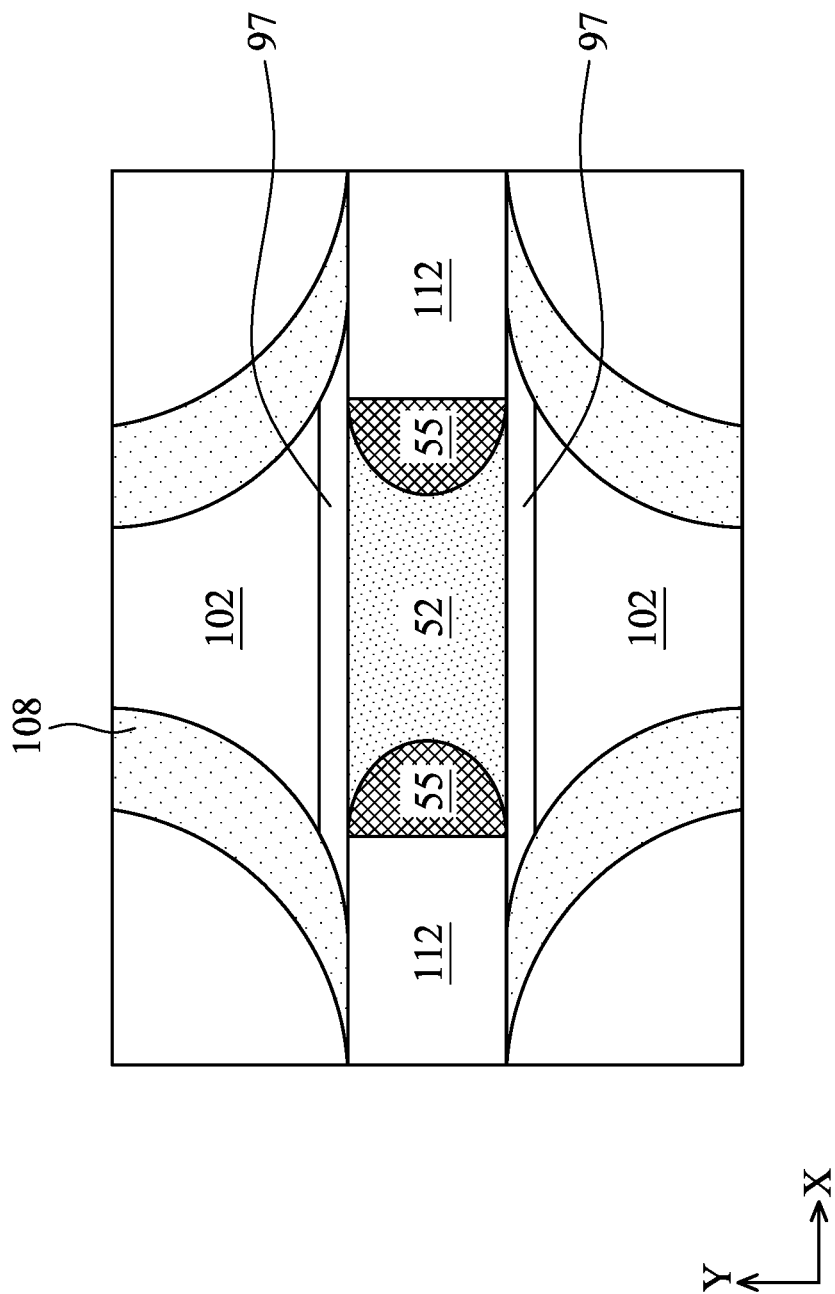

FIGS. 3A, 3B, 4A, 4B, 5A-5D, 6A-6C, 7A-7D, 8A, 8B, 9A-9D, 10A, 10B, 11A, 11B, 12A, and 12B are cross-sectional views of the NSFET device 100 at subsequent stages of manufacturing, in accordance with an embodiment. FIGS. 3A, 4A, 5A, 6A, 7A, 8A, 9A, 10A, and 11A are cross-sectional views along cross-section B-B in FIG. 1. FIGS. 3B, 4B, 5C, 6C, 7C, 8B, 9B, 10B, and 11B are cross-sectional views along cross-section A-A in FIG. 1. FIGS. 5B, 6B, and 7B are cross-sectional views along cross-section D-D in FIG. 1. Although two fins and two gate structures are illustrated in the figures as a non-limiting example, it should be appreciated that other numbers of fins and other numbers of gate structures may also be formed.

Figure 3B:
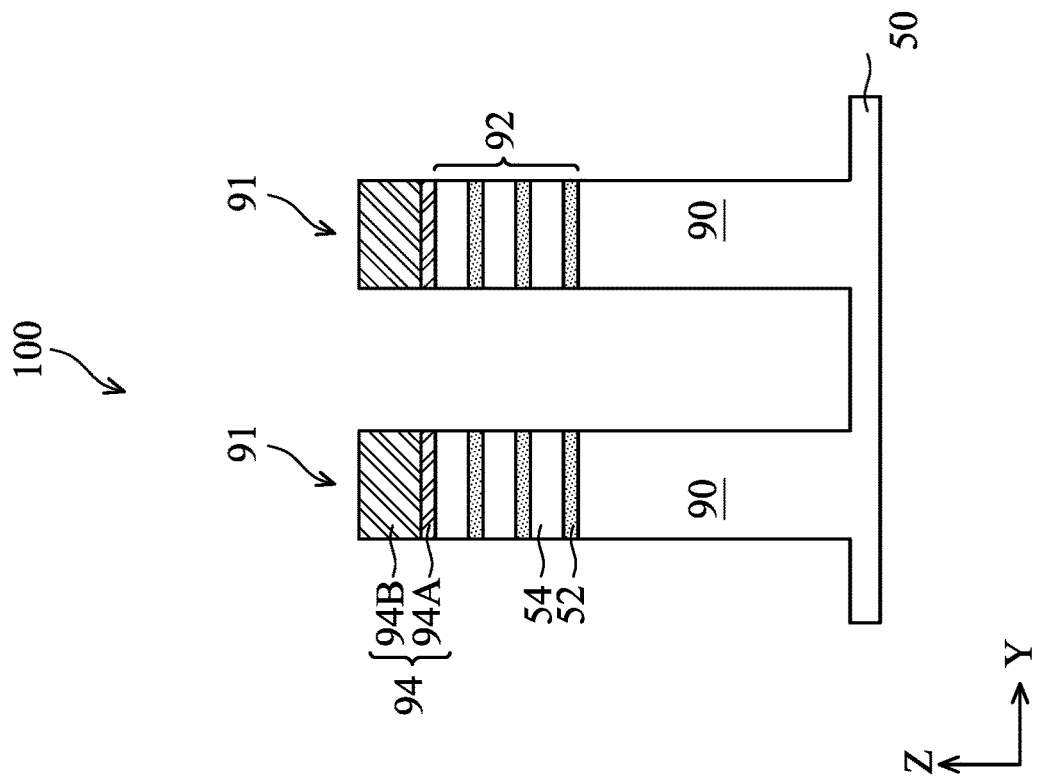
Figure 3A:
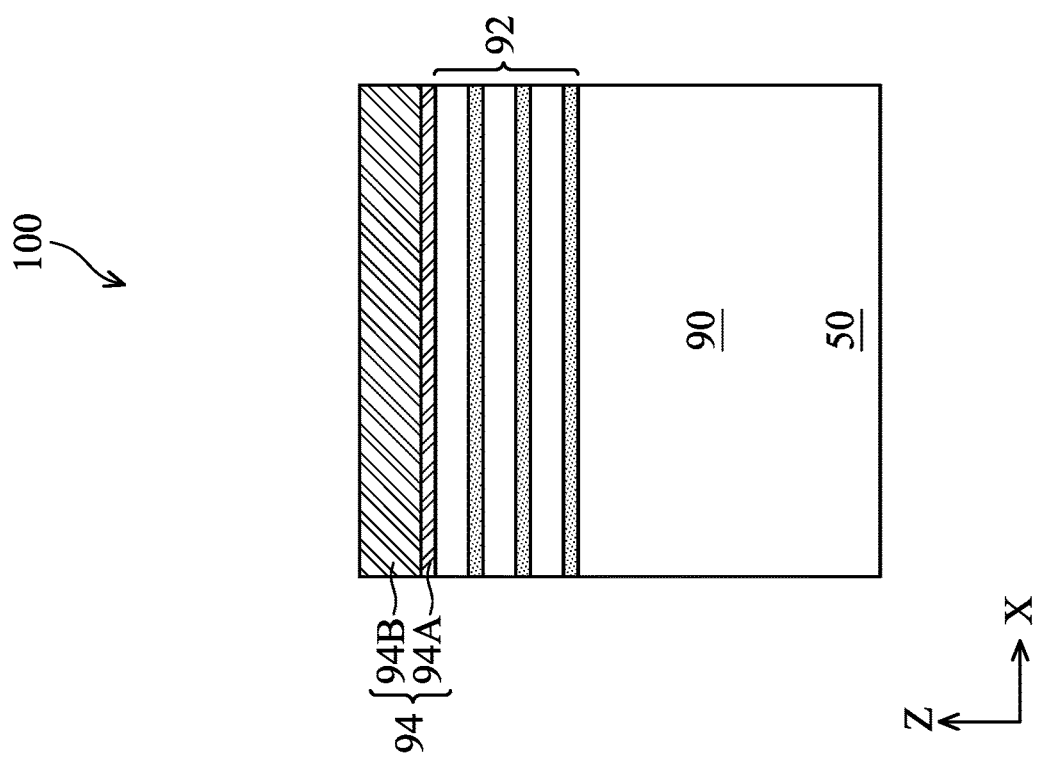

In FIGS. 3A and 3B, fins 91 are formed protruding above the substrate 50. Each of the fins 91 includes a semiconductor strip 90 and a layer stack 92 overlying the semiconductor strip 90. The layer stack 92 and the semiconductor strip 90 may be formed by etching trenches in the multi-layer stack 64 and the substrate 50, respectively. The layer stack 92 and the semiconductor strip 90 may be formed by a same etching process.

The fins 91 may be patterned by any suitable method. For example, the fins 91 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern, e.g., the fins 91.

In some embodiments, the remaining spacers are used to pattern a mask 94, which is then used to pattern the fins 91. The mask 94 may be a single layer mask, or may be a multilayer mask such as a multilayer mask that includes a first mask layer 94A and a second mask layer 94B. The first mask layer 94A and second mask layer 94B may each be formed from a dielectric material such as silicon oxide, silicon nitride, a combination thereof, or the like, and may be deposited or thermally grown according to suitable techniques. The first mask layer 94A and second mask layer 94B are different materials having a high etching selectivity. For example, the first mask layer 94A may be silicon oxide, and the second mask layer 94B may be silicon nitride. The mask 94 may be formed by patterning the first mask layer 94A and the second mask layer 94B using any acceptable etching process. The mask 94 may then be used as an etching mask to etch the substrate 50 and the multi-layer stack 64. The etching may be any acceptable etch process, such as a reactive ion etch (RIE), neutral beam etch (NBE), the like, or a combination thereof. The etching is an anisotropic etching process, in some embodiments. After the etching process, the patterned multi-layer stack 64 forms the layer stack 92, and the patterned substrate 50 forms the semiconductor strip 90, as illustrated in FIGS. 3A and 3B. Therefore, in the illustrated embodiment, the layer stack 92 also includes alternating layers of the first semiconductor material 52 and the second semiconductor material 54, and the semiconductor strip 90 is formed of a same material (e.g., silicon) as the substrate 50.

Figure 4B:
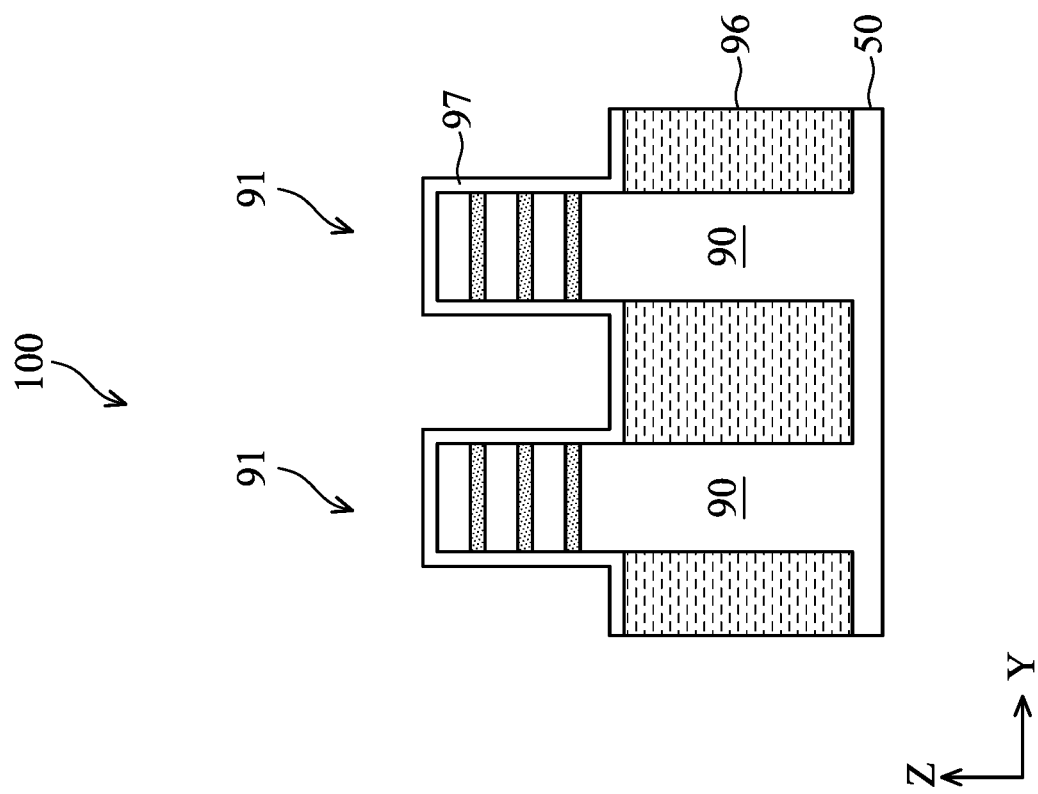
Figure 4A:
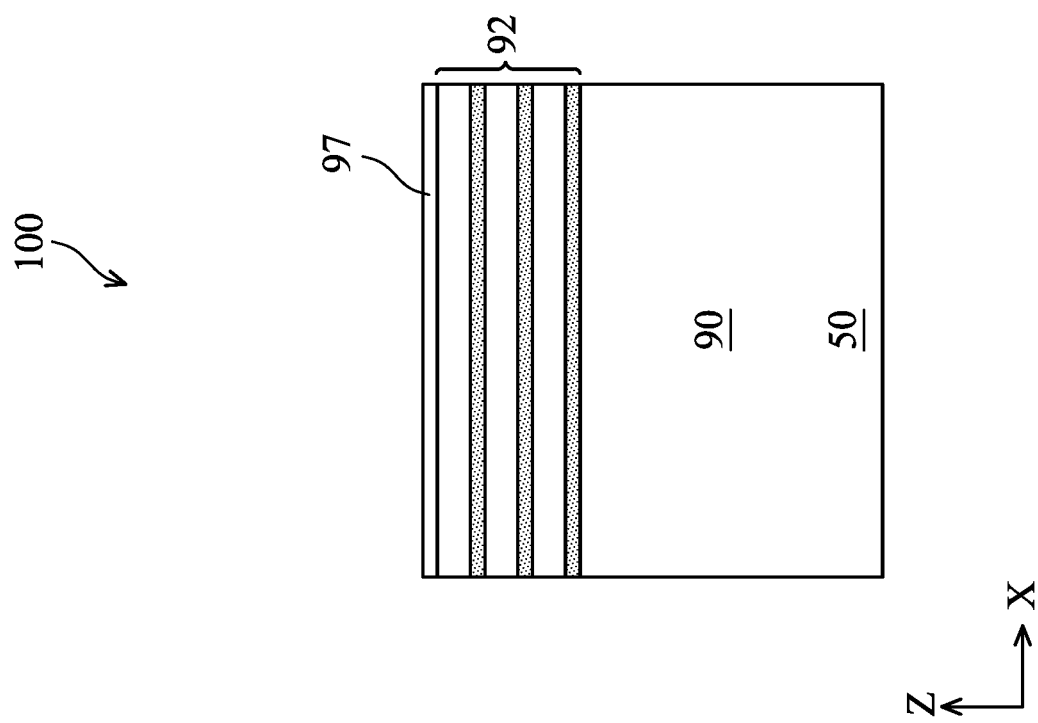

Next, in FIGS. 4A and 4B, shallow trench isolation (STI) regions 96 are formed over the substrate 50 and on opposing sides of the fins 91. As an example to form the STI regions 96, an insulation material may be formed over the substrate 50. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by an FCVD process. An anneal process may be performed after the insulation material is formed.

In some embodiments, the insulation material is formed such that excess insulation material covers the fins 91. In some embodiments, a liner is first formed along surfaces of the substrate 50 and fins 91, and a fill material, such as those discussed above is formed over the liner. In some embodiments, the liner is omitted.

Next, a removal process is applied to the insulation material to remove excess insulation material over the fins 91. In some embodiments, a planarization process, such as a chemical mechanical polish (CMP), an etch back process, combinations thereof, or the like may be utilized. The planarization process exposes the layer stacks 92 such that top surfaces of the layer stacks 92 and the insulation material are level after the planarization process is complete. Next, the insulation material is recessed to form the STI regions 96. The insulation material is recessed such that the layer stacks 92 protrude from between neighboring STI regions 96. Top portions of the semiconductor strips 90 may also protrude from between neighboring STI regions 96. Further, the top surfaces of the STI regions 96 may have a flat surface as illustrated, a convex surface, a concave surface (such as dishing), or a combination thereof. The top surfaces of the STI regions 96 may be formed flat, convex, and/or concave by an appropriate etch. The STI regions 96 may be recessed using an acceptable etching process, such as one that is selective to the material of the insulation material (e.g., etches the material of the insulation material at a faster rate than the material of the semiconductor strip 90 and the layer stack 92). For example, a chemical oxide removal with a suitable etchant such as dilute hydrofluoric (dHF) acid may be used.

Still referring to FIGS. 4A and 4B, a dummy dielectric layer 97 is formed over the layer stack 92 and over the STI regions 96. The dummy dielectric layer 97 may be, for example, silicon oxide, silicon nitride, a combination thereof, or the like, and may be deposited or thermally grown according to acceptable techniques. In an embodiment, a layer of silicon is conformally formed over the layer stack 92 and over the upper surface of the STI regions 96, and a thermal oxidization process is performed to convert the deposited silicon layer into an oxide layer as the dummy dielectric layer 97.

Figures 1, 5A:
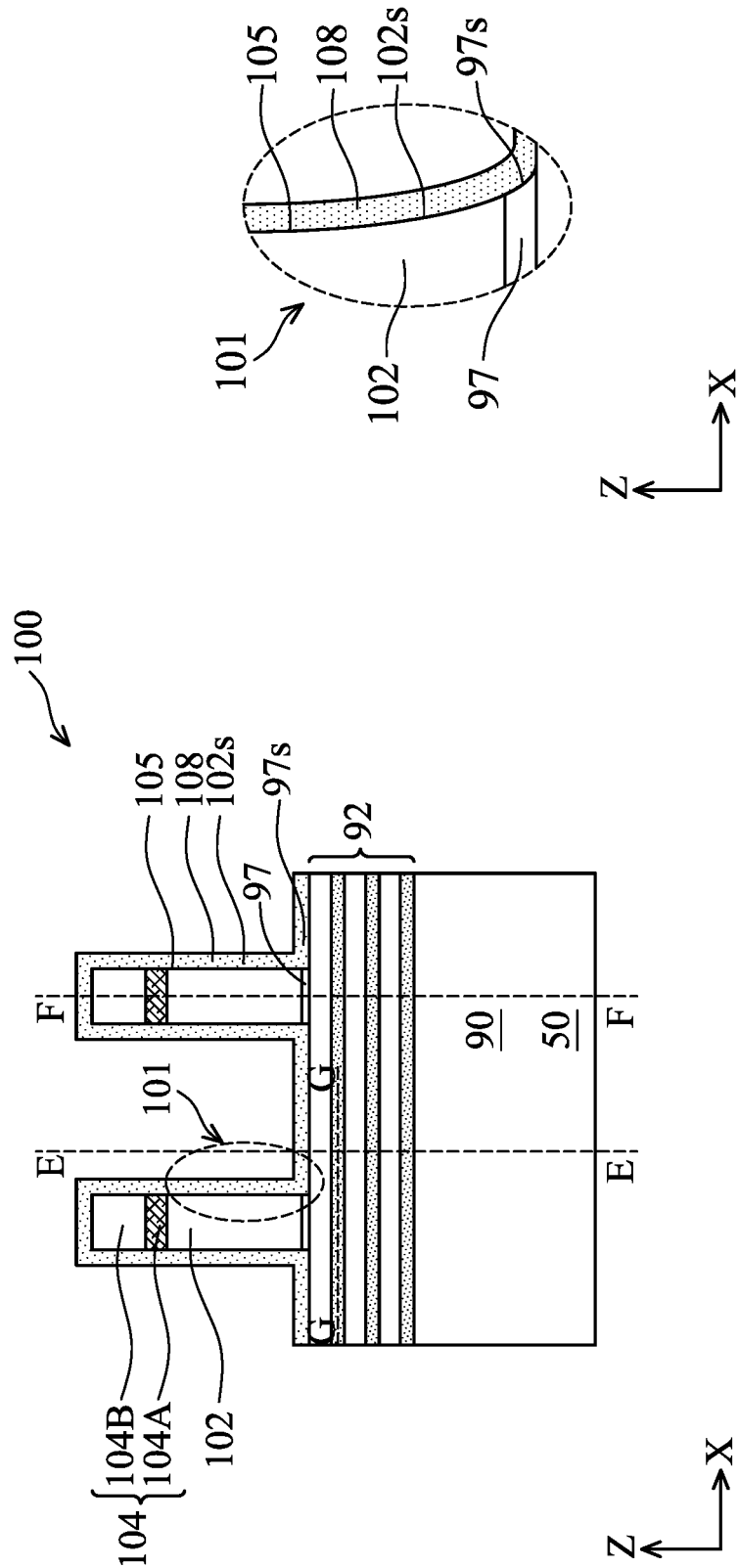
Figure 5C:
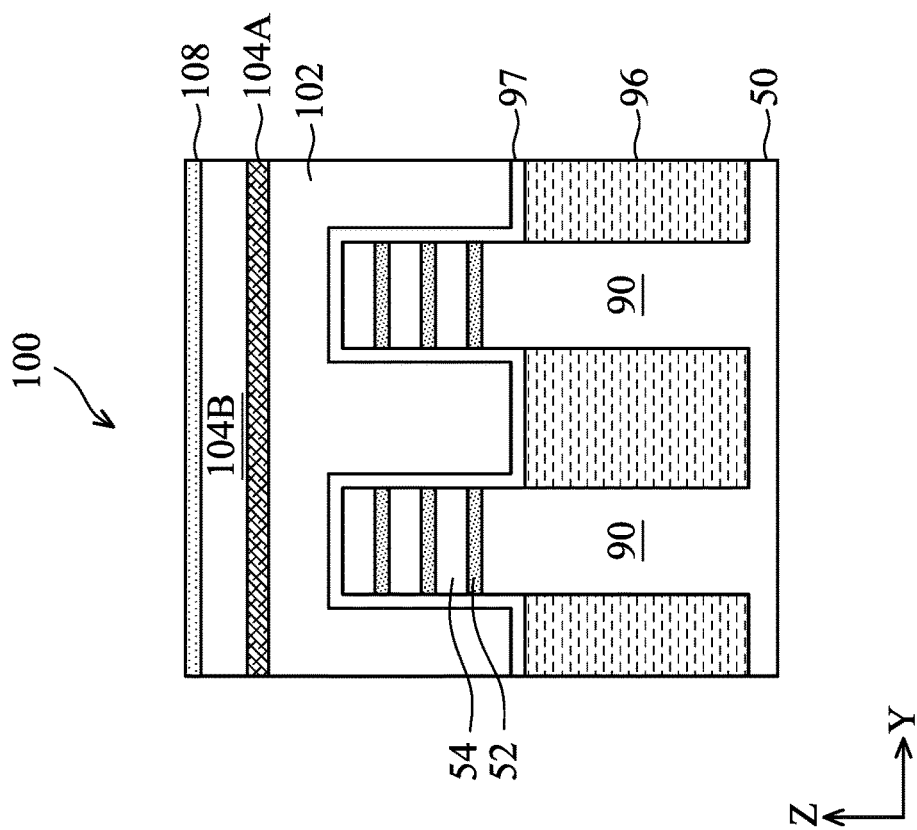
Figure 5B:
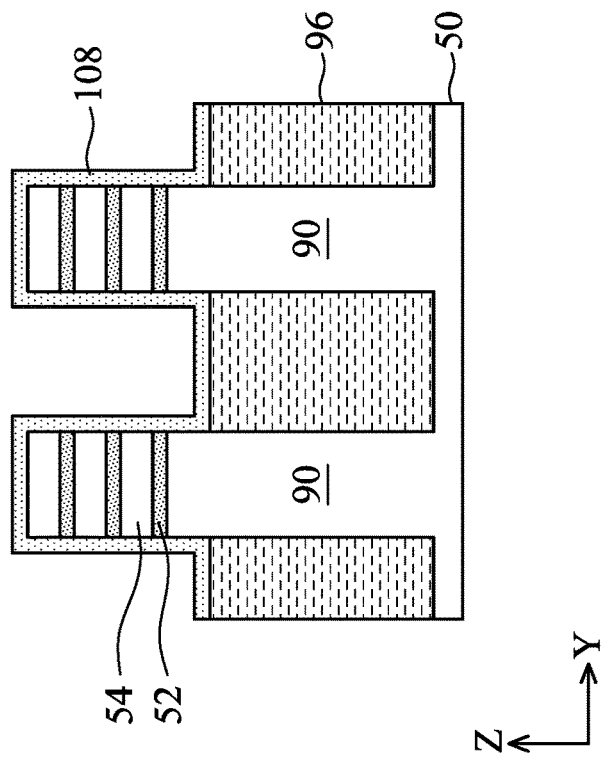

Next, in FIGS. 5A-5D, dummy gates 102 are formed over the fins 91. FIGS. 5B and 5C illustrate cross-sectional views of the NSFET device 100 in FIG. 5A along cross-sections E-E and F-F in FIG. 5A, respectively. The cross-sections E-E and F-F correspond to cross-sections D-D and A-A in FIG. 1, respectively. To form the dummy gates 102, a dummy gate layer may be formed over the dummy dielectric layer 97. The dummy gate layer may be deposited over the dummy dielectric layer 97 and then planarized, such as by a CMP. The dummy gate layer may be a conductive material and may be selected from a group including amorphous silicon, polycrystalline-silicon (polysilicon), poly-crystalline silicon-germanium (poly-SiGe), or the like. The dummy gate layer may be deposited by physical vapor deposition (PVD), CVD, sputter deposition, or other techniques known and used in the art. The dummy gate layer may be made of other materials that have a high etching selectivity from the isolation regions 96.

Masks 104 are then formed over the dummy gate layer. The masks 104 may be formed from silicon nitride, silicon oxynitride, combinations thereof, or the like, and may be patterned using acceptable photolithography and etching techniques. In the illustrated embodiment, the mask 104 includes a first mask layer 104A (e.g., a silicon oxide layer) and a second mask layer 104B (e.g., a silicon nitride layer). The pattern of the masks 104 is then transferred to the dummy gate layer by an acceptable etching technique to form the dummy gates 102, and then transferred to the dummy dielectric layer by acceptable etching technique to form the dummy gate dielectric layers 97. The dummy gates 102 cover respective channel regions of the layer stacks 92. The pattern of the masks 104 may be used to physically separate each of the dummy gates 102 from adjacent dummy gates. The dummy gates 102 may also have a lengthwise direction substantially perpendicular to the lengthwise direction of the fins 91. The dummy gate 102 and the dummy gate dielectric layer 97 are collectively referred to as dummy gate structure, in some embodiments.

Figure 5D:
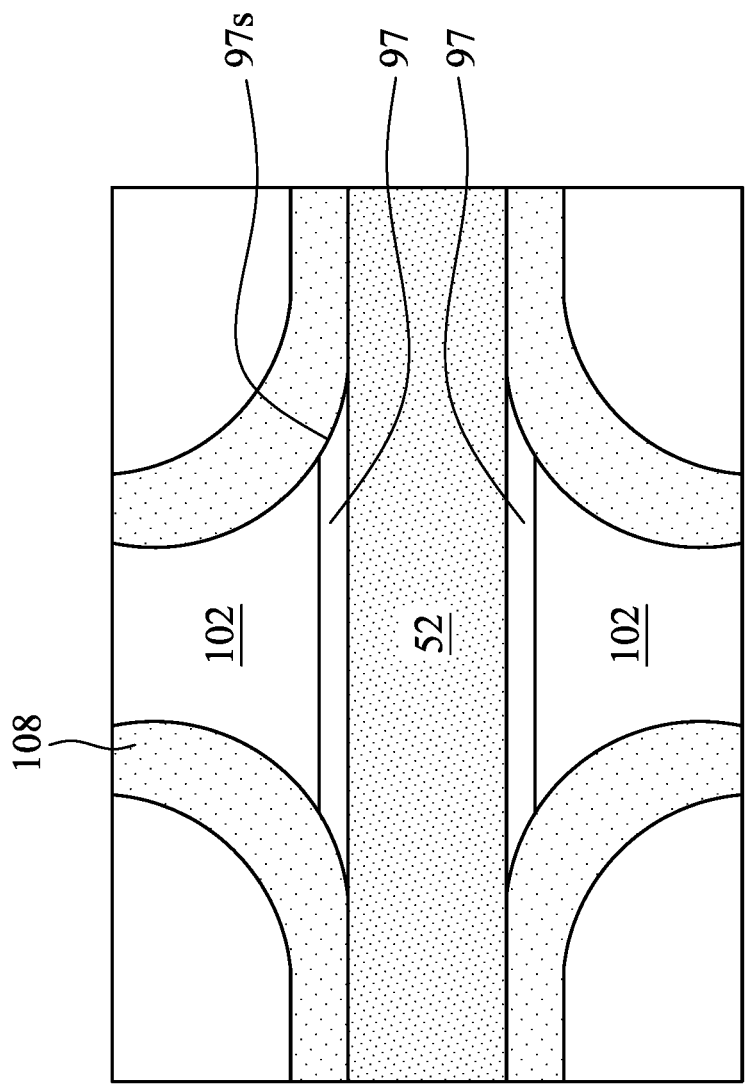

FIG. 5A-1 is an enlarged portion 101 of the NSFET device 100 of FIG. 5A. In some embodiments, the dummy gate structure may have a curved side surface 105, as shown in FIG. 5A-1. The curved side surface 105 may include a curved side surface 102s of the dummy gate 102 and a curved side surface 97s of the dummy gate dielectric layer 97. In some embodiments, the curved side surface 105 is a concave surface, and the dummy gate dielectric layer 97 has a width substantially greater than a width of the dummy gate 102 as a result of the concave side surface 105. As shown in FIG. 5A-1, the curved side surface 97s is shown in the x-z plane. In some embodiments, the curved side surface 97s is also shown in the x-y plane, as shown in FIG. 5D, which is a cross-sectional top view of the NSFET device 100 along cross-section G-G in FIG. 5A.

Next, a gate spacer layer 108 is formed by conformally depositing an insulating material over the layer stacks 92, STI regions 96, and dummy gates 102, as shown in FIGS. 5A-5C. The insulating material may be silicon nitride, silicon carbonitride, a combination thereof, or the like. In some embodiments, the gate spacer layer 108 includes multiple sublayers. For example, a first sublayer (sometimes referred to as a gate seal spacer layer) may be formed by thermal oxidation or a deposition, and a second sublayer (sometimes referred to as a main gate spacer layer) may be conformally deposited on the first sublayer.

As shown in FIG. 5A-1, the gate spacer layer 108 is formed on the side surface 102s and the side surface 97s. Because the side surface 97s extends further in a lateral direction than the side surface 102s, the gate spacer layer 108 is disposed over the side surface 97s.

Next, in FIGS. 6A-6C, the gate spacer layers 108 are etched by an anisotropic etching process to form gate spacers 108. FIGS. 6B and 6C illustrate cross-sectional views of the NSFET device 100 in FIG. 6A along cross-sections E-E and F-F, respectively. The anisotropic etching process may remove horizontal portions of the gate spacer layer 108 (e.g., portions over the STI regions 96 and dummy gates 102), with remaining vertical portions of the gate spacer layer 108 (e.g., along sidewalls of the dummy gates 102 and the dummy gate dielectric layer 97) forming the gate spacers 108.

After the formation of the gate spacers 108, implantation for lightly doped source/drain (LDD) regions (not shown) may be performed. Appropriate type (e.g., p-type or n-type) impurities may be implanted into the exposed layer stacks 92 and/or semiconductor strips 90. The n-type impurities may be any suitable n-type impurities, such as phosphorus, arsenic, antimony, or the like, and the p-type impurities may be any suitable p-type impurities, such as boron or the like.

Next, openings 110 (which may also be referred to as recesses) are formed in the layer stacks 92, as shown in FIG. 6A. The openings 110 may extend through the layer stacks 92 and into the semiconductor strips 90. The openings 110 may be formed by any acceptable etching technique.

After the openings 110 are formed, a selective etching process is performed to recess end portions of the first semiconductor material 52 exposed by the openings 110 without substantially affecting the second semiconductor material 54. After the selective etching process, recesses are formed in the first semiconductor material 52 at locations where the removed end portions used to be.

Next, an inner spacer layer is formed (e.g., conformally) in the opening 110. The inner spacer layer also fills the recesses in the first semiconductor material 52 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. Next, an etching process, such as an anisotropic etching process, is performed to remove portions of the inner spacer layers disposed outside the recesses in the first semiconductor material 52. The remaining portions of the inner spacer layers (e.g., portions disposed inside the recesses in the first semiconductor material 52) form the inner spacers 55.

Next, in FIGS. 7A-7D, source/drain regions 112 are formed in the openings 110. FIGS. 7B and 7C illustrate cross-sectional views of the NSFET device 100 along cross-section E-E and F-F in FIG. 7A, respectively, and FIG. 7D is a top cross-sectional view of the NSFET device 100 along cross-section H-H in FIG. 7A. In the illustrated embodiment, the source/drain regions 112 are formed of an epitaxial material(s), and therefore, may also be referred to as epitaxial source/drain regions 112. In some embodiments, the epitaxial source/drain regions 112 are formed in the openings 110 to exert stress in the respective channel regions of the NSFET device formed, thereby improving performance. The epitaxial source/drain regions 112 are formed such that each dummy gate 102 is disposed between respective neighboring pairs of the epitaxial source/drain regions 112. In this disclosure, a source and a drain are interchangeably used, and the structures thereof are substantially the same. Furthermore, source/drain region(s) may refer to a source or a drain, individually or collectively dependent upon the context.

As shown in FIG. 7D, in some embodiments, the epitaxial source/drain regions 112 are in contact with the dummy gate dielectric layer 97 as a result of the curved side surface 105 (FIG. 5A-1). For example, when forming the openings 110 (FIG. 6A) and the inner spacers 55 (FIG. 6A), the edge portions of the dummy gate dielectric layer 97 formed on the sidewalls of the layer stack 92 may be exposed. The exposed edge portions of the dummy gate dielectric layer 97 may be then in contact with the subsequently formed epitaxial source/drain regions 112, as shown in FIG. 7D.

The epitaxial source/drain regions 112 are epitaxially grown in the openings 110. The epitaxial source/drain regions 112 may include any acceptable material, such as appropriate for n-type or p-type device. For example, when n-type devices are formed, the epitaxial source/drain regions 112 may include materials exerting a tensile strain in the channel regions, such as silicon, SiC, SiCP, SiP, or the like. Likewise, when p-type devices are formed, the epitaxial source/drain regions 112 may include materials exerting a compressive strain in the channel regions, such as SiGe, SiGeB, Ge, GeSn, or the like. The epitaxial source/drain regions 112 may have surfaces raised from respective surfaces of the fins and may have facets, as shown in FIG. 7B.

The epitaxial source/drain regions 112 and/or the fins may be implanted with dopants to form source/drain regions, similar to the process previously discussed for forming lightly-doped source/drain regions, followed by an anneal. The n-type and/or p-type impurities for source/drain regions may be any of the impurities previously discussed. In some embodiments, the epitaxial source/drain regions 112 may be in situ doped during growth.

As a result of the epitaxy processes used to form the epitaxial source/drain regions 112, upper surfaces of the epitaxial source/drain regions 112 have facets which expand laterally outward beyond sidewalls of the fins 91. In the illustrated embodiment, adjacent epitaxial source/drain regions 112 remain separated (FIG. 7B) after the epitaxy process is completed. In other embodiments, these facets cause adjacent epitaxial source/drain regions 112 of a same NSFET to merge.

Next, a contact etch stop layer (CESL) 116 is formed (e.g., conformally) over the source/drain regions 112 and over the dummy gate 102, and an inter-layer dielectric (ILD) 114 is then deposited over the CESL 116, as shown in FIGS. 7A-7C. The CESL 116 is formed of a material having a different etch rate than the first ILD 114, and may be formed of silicon nitride using PECVD, although other dielectric materials such as silicon oxide, silicon oxynitride, combinations thereof, or the like, and alternative techniques of forming the CESL 116, such as low pressure CVD (LPCVD), PVD, or the like, could alternatively be used.

The ILD 114 may be formed of a dielectric material, and may be deposited by any suitable method, such as CVD, plasma-enhanced CVD (PECVD), or FCVD. Dielectric materials for the ILD 114 may include silicon oxide, phospho-silicate glass (PSG), boro-silicate glass (BSG), boron-doped phospho-silicate glass (BPSG), undoped silicate glass (USG), or the like. Other insulation materials formed by any acceptable process may be used.

Figures 8A, 8B:
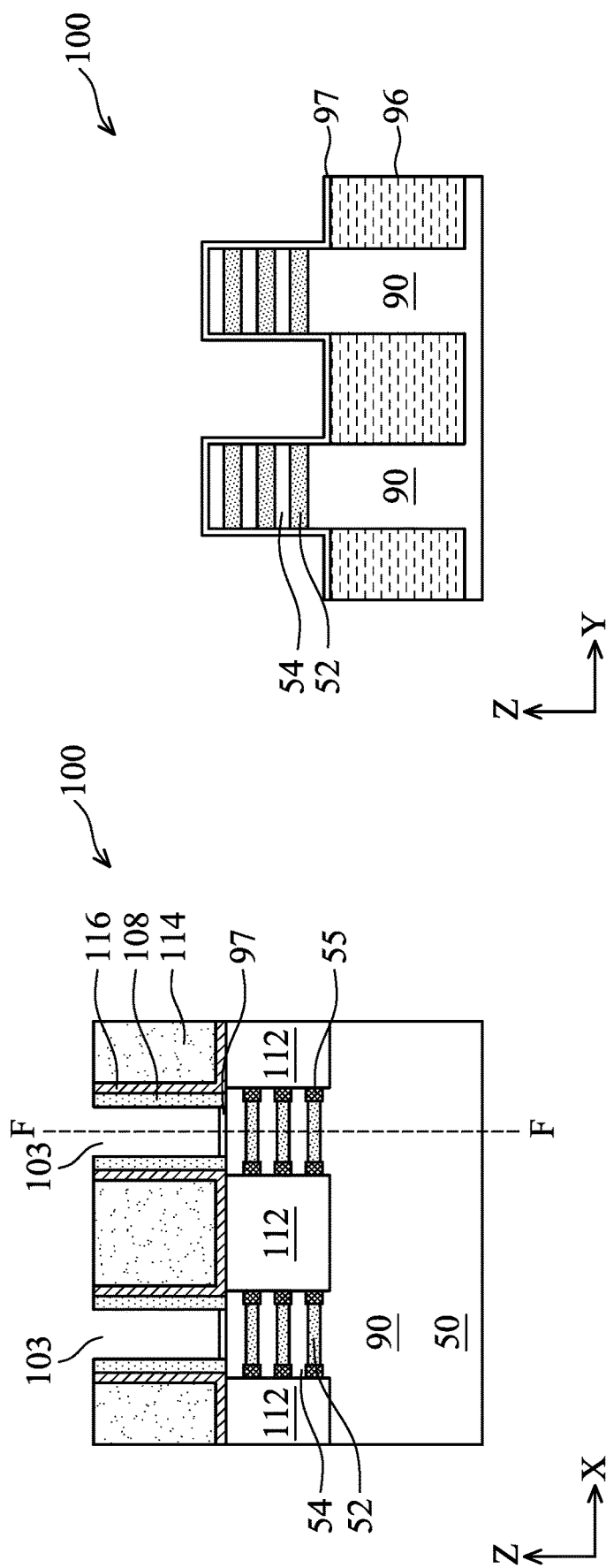

Next, as shown in FIGS. 8A and 8B, the dummy gates 102 are removed. FIG. 8B illustrates the cross-sectional view of the NSFET device 100 of FIG. 8A along the cross-section F-F. To remove the dummy gates 102, a planarization process, such as a CMP, is performed to level the top surfaces of the ILD 114 and CESL 116 with the top surfaces of the dummy gates 102 and gate spacers 108. The planarization process may also remove the masks 104 (FIG. 7A) on the dummy gates 102, and portions of the gate spacers 108 along sidewalls of the masks 104. After the planarization process, top surfaces of the dummy gates 102, gate spacers 108, and ILD 114 are level. Accordingly, the top surfaces of the dummy gates 102 are exposed through the ILD 114.

Next, the dummy gates 102 are removed in an etching step(s), so that recesses 103 are formed. In some embodiments, the dummy gates 102 are removed by an anisotropic dry etch process. For example, the etching process may include a dry etch process using reaction gas(es) that selectively etch the dummy gates 102 without etching the ILD 114 or the gate spacers 108. During the removal of the dummy gates 102, the dummy gate dielectric layer 97 may be used as an etch stop layer when the dummy gates 102 are etched. The dummy gate dielectric layer 97 may protect the second semiconductor material 54 (which is the nanostructure 54) during the removal of the dummy gates 102.

Figures 9A, 9B:
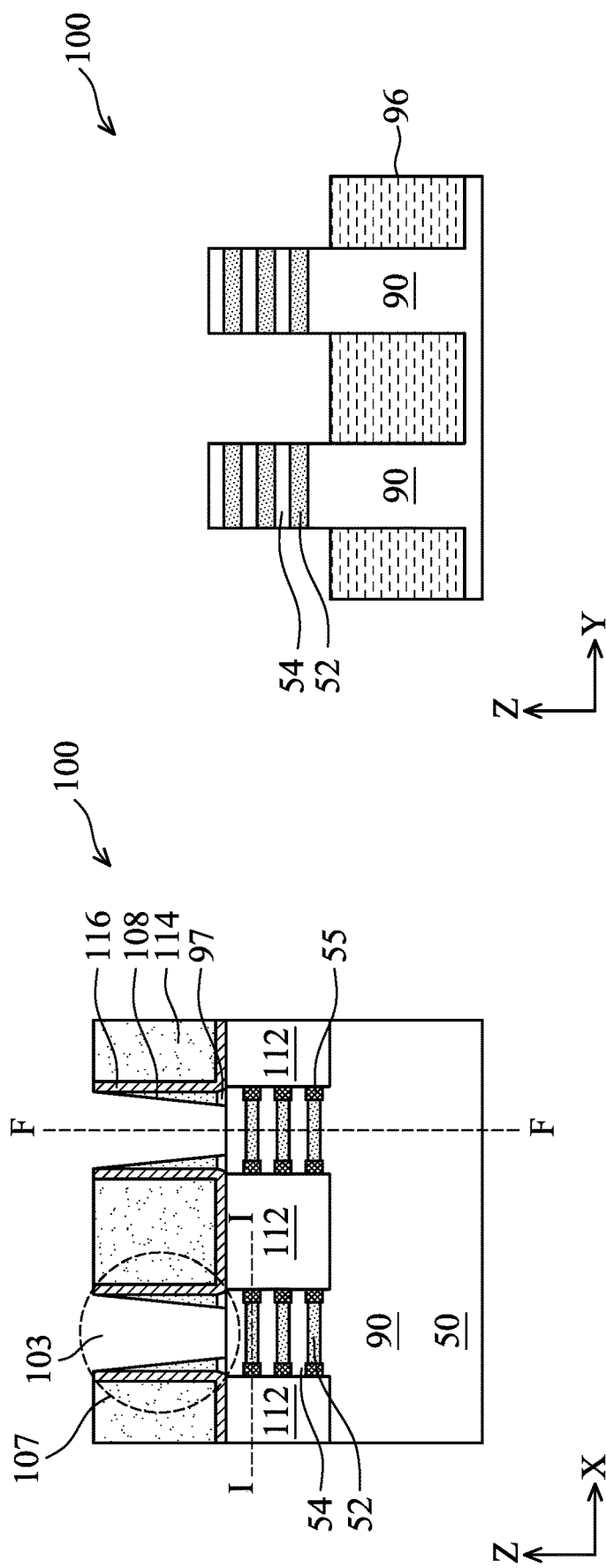
Figure 9D:
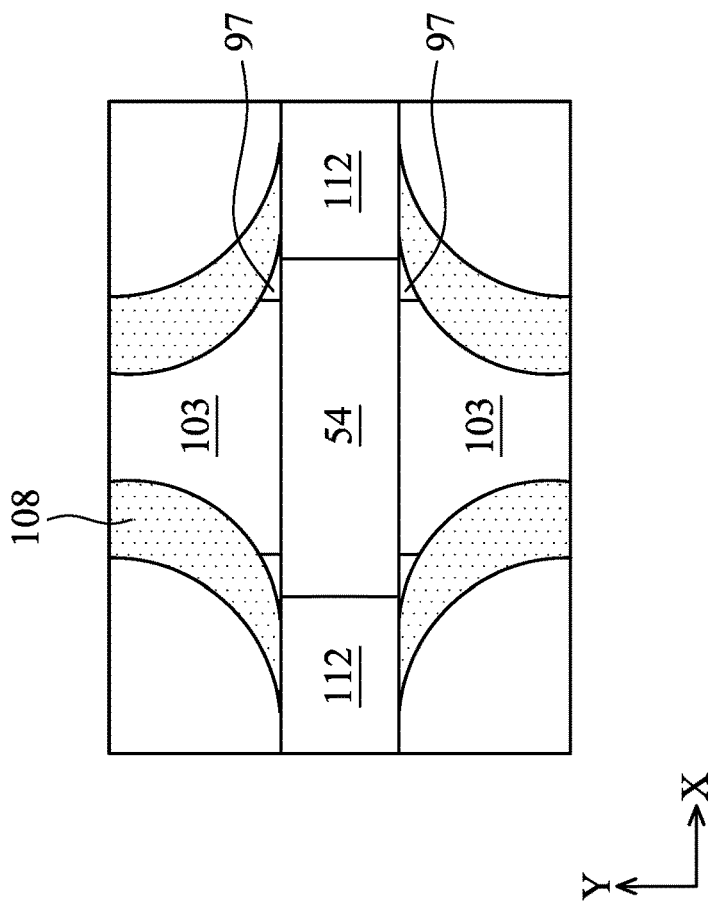
Figure 9C:
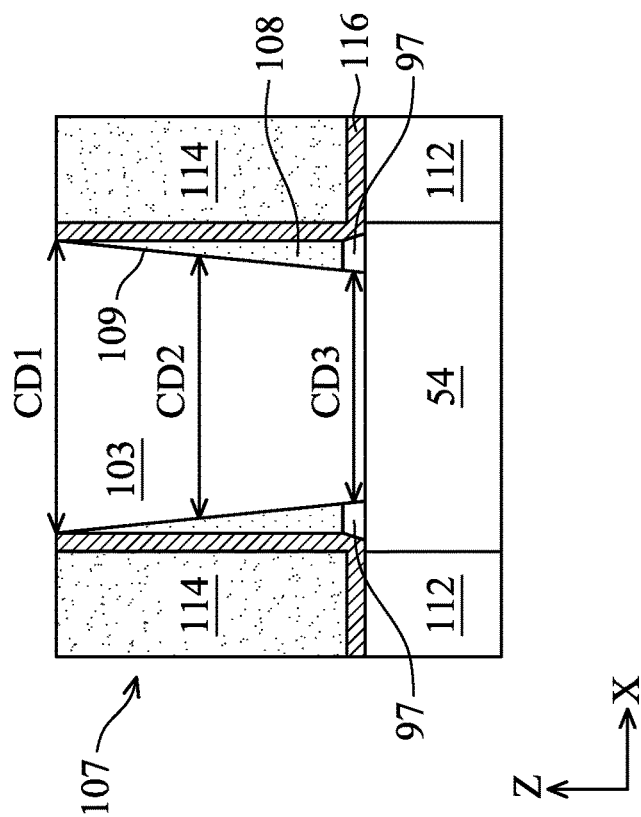

Next, as shown in FIGS. 9A-9D, a portion of the dummy gate dielectric layer 97 in the recesses 103 is removed. FIG. 9B illustrates a cross-sectional view of the NSFET device 100 along cross-section F-F in FIG. 9A, FIG. 9C illustrates an enlarged portion 107 of the NSFET device 100 shown in FIG. 9A, and FIG. 9D is a top cross-sectional view of the NSFET device 100 along cross-section I-I in FIG. 9A. An etching process, such as a cyclic etching process, may be performed to remove the portion of the dummy gate dielectric layer 97. In some embodiments, the cyclic etching process includes exposing the dummy gate dielectric layer 97 to etchants, such as HF and $NH_3$, and reacting the surface of the dummy gate dielectric layer 97 with the etchants to form a reaction product. In some embodiments, the reaction product may be ammonium fluorosilicate (AFS). The amount of AFS may be controlled to protect the edge portions of the dummy gate dielectric layer 97. In some embodiments, in order to form the predetermined amount of AFS, the flow rate of $NH_3$ is substantially greater than the flow rate of HF. For example, the ratio of the flow rate of HF to the flow rate of $NH_3$ may range from about 1:4 to about 1:8. The reaction product may be formed at a processing temperature ranging from about 15 degrees Celsius to about 85 degrees Celsius. The formation of the reaction product may be a self-limiting process. For example, when the exposed surface of the dummy gate dielectric layer 97 is reacted with the etchants to form the reaction product, the reaction product blocks the etchants from contacting the dummy gate dielectric layer 97. In some embodiments, the reaction product, such as AFS, expands after it's formed, which can fill gaps in corner areas.

After the formation of the reaction product, a baking process is performed to remove the reaction product. The baking process may have a baking temperature ranging from about 100 degrees Celsius to about 200 degrees Celsius. During the baking process, the etchants are not flowed into the processing chamber.

The formation of the reaction product and the removal of the reaction product are considered a cycle of the cyclic etching process. One or more cycles may be performed to remove a portion of the dummy gate dielectric layer 97. In some embodiments, in order to keep edge portions of the dummy gate dielectric layer 97 that are in contact with the epitaxial source/drain regions 112, the number of cycles ranges from about 1 to 5. If the number of cycles is less than 1, the portion of the dummy gate dielectric layer 97 is not removed. On the other hand, if the number of cycles is greater than 5, the edge portions of the dummy gate dielectric layer 97 may be removed, and the epitaxial source/drain regions 112 are exposed. The exposed epitaxial source/drain regions 112 may short out the subsequently formed gate stack.

Figures 11A, 11B:
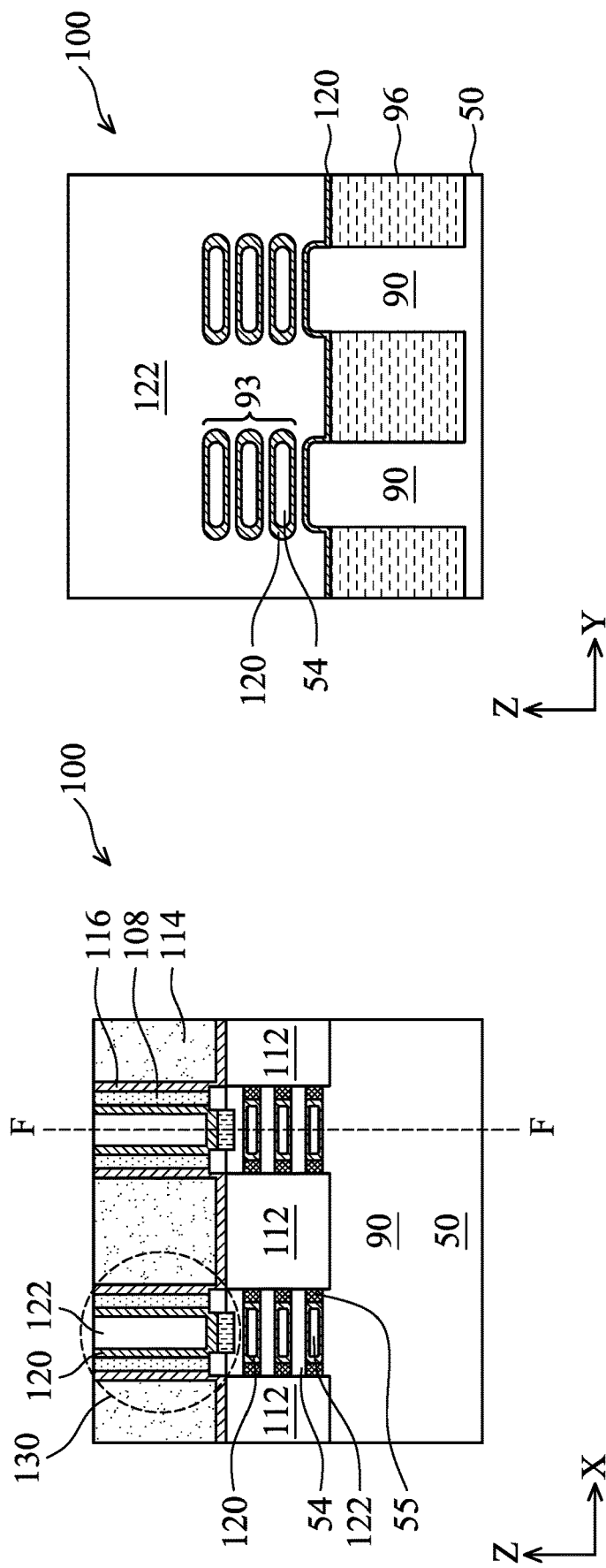
Figure 11C:
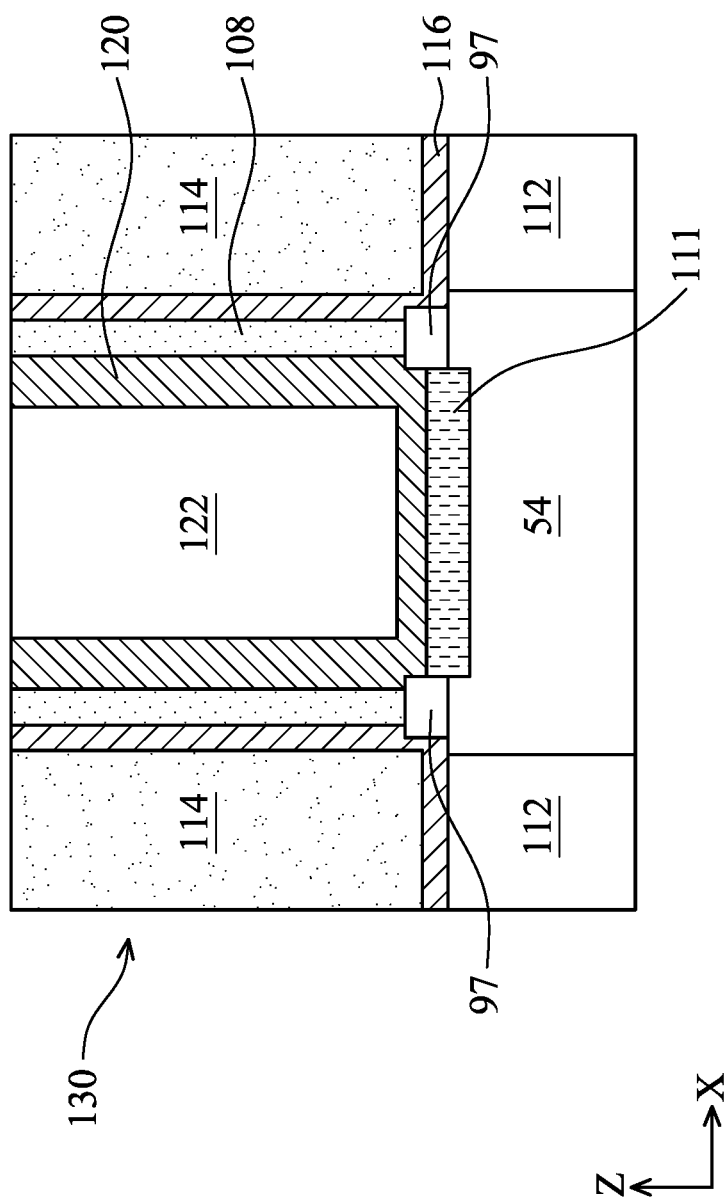

As shown in FIG. 9C, in some embodiments, portions of the gate spacers 108 are also removed during the removal of the portion of the dummy gate dielectric layer 97. For example, the gate spacers 108 each includes a slanted side surface 109. As a result, the recess 103 has different critical dimensions CD1, CD2, and CD3. In some embodiments, the critical dimension CD1, which is located at the top of the recess 103, is substantially greater than the critical dimension CD2, which is located at the center of the recess 103. The critical dimension CD2 may be substantially greater than the critical dimension CD3, which is located at the bottom of the recess 103. In some embodiments, the critical dimension CD2 is about 1 nm to about 10 nm greater than the critical dimension CD3, and the critical dimension CD1 is about 1 nm to about 15 nm greater than the critical dimension CD2. The larger critical dimension CD1 leads to improved gap fill of the subsequently formed gate electrode 122 (FIG. 11A-11C). The smaller critical dimension CD3 leads to reduced risk of exposing the epitaxial source/drain regions 112. In some embodiments, the critical dimension CD3 is about 50 percent to about 79 percent of the length of the second semiconductor material 54 in the x-direction.

As shown in FIG. 9D, the edge portions of the dummy dielectric layer 97 cover the epitaxial source/drain regions 112 in the recess 103, as a result of the cyclic etching process described above. If the edge portions of the dummy dielectric layer 97 are removed, the epitaxial source/drain regions 112 may be exposed, and the risk of shorting out the subsequently formed gate stack is increased.

Figures 10A, 10B:
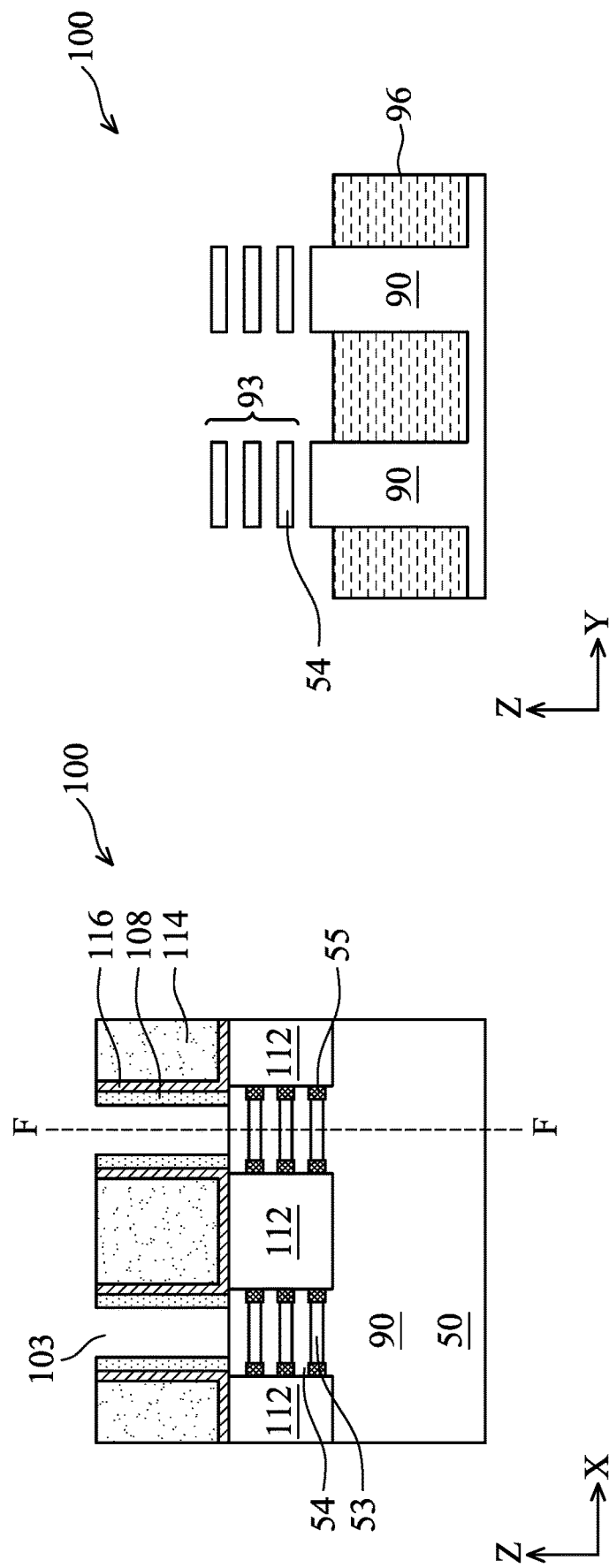

Next, as shown in FIGS. 10A and 10B, the first semiconductor material 52 is removed to release the second semiconductor material 54. After the first semiconductor material 52 is removed, the second semiconductor material 54 forms a plurality of nanostructures 54 that extend horizontally (e.g., parallel to a major upper surface of the substrate 50). The nanostructures 54 may be collectively referred to as the channel regions 93 or the channel layers 93 of the NSFET device 100. As illustrated in FIG. 10A, gaps 53 (e.g., empty spaces) are formed between the nanostructures 54 by the removal of the first semiconductor material 52. In some embodiments, the nanostructures 54 are nanosheets or nanowires, depending on, e.g., the dimensions (e.g., size and/or aspect ratio) of the nanostructures 54.

In some embodiments, the first semiconductor material 52 is removed by a selective etching process using an etchant that is selective to (e.g., having a higher etch rate for) the first semiconductor material 52, such that the first semiconductor material 52 is removed without substantially attacking the second semiconductor material 54. In some embodiments, an isotropic etching process is performed to remove the first semiconductor material 52. The isotropic etching process is performed using an etching gas, and optionally, a carrier gas, where the etching gas includes $F_2$ and HF, and the carrier gas may be an inert gas such as Ar, He, $N_2$, combinations thereof, or the like.

Next, as shown in FIGS. 11A-11C, gate dielectric layers 120 and gate electrodes 122 are formed for replacement gates. The gate dielectric layers 120 are deposited conformally in the recesses 103, such as over the top surfaces and the sidewalls of the semiconductor strip 90, and on sidewalls of the gate spacers 108. The gate dielectric layers 120 may also be formed on the top surface of the first ILD 114. Notably, the gate dielectric layers 120 wrap around the nanostructures 54. In accordance with some embodiments, the gate dielectric layers 120 includes silicon oxide, silicon nitride, or multilayers thereof. In some embodiments, the gate dielectric layers 120 include a high-k dielectric material, and in these embodiments, the gate dielectric layers 120 may have a k value greater than about 7.0, and may include a metal oxide or a silicate of Hf, Al, Zr, La, Mg, Ba, Ti, or Pb, or combinations thereof. The formation methods of the gate dielectric layers 120 may include molecular-beam deposition (MBD), ALD, PECVD, and the like.

Next, the gate electrodes 122 are deposited over and around the gate dielectric layers 120, and fill the remaining portions of the recesses 103. The gate electrodes 122 may include a metal-containing material such as TiN, TiO, TaN, TaC, Co, Ru, Al, W, combinations thereof, or multi-layers thereof. For example, although a single layer gate electrode 122 is illustrated, the gate electrode 122 may include any number of liner layers (e.g., barrier layers), any number of work function tuning layers, and a fill material. After the filling of the gate electrodes 122, a planarization process, such as a CMP, may be performed to remove the excess portions of the gate dielectric layers 120 and the material of the gate electrodes 122, which excess portions are over the top surface of the first ILD 114. The remaining portions of material of the gate electrodes 122 and the gate dielectric layers 120 thus form replacement gates of the resulting NSFET device 100. Each gate electrode 122 and the corresponding gate dielectric layers 120 may be collectively referred to as a gate stack, a replacement gate structure, or a metal gate structure. Each gate stack extends around the respective nanostructures 54.

FIG. 11C is an enlarged portion 130 of the NSFET device 100 of FIG. 11A. In some embodiments, the gate spacers 108 do not include the slanted side surfaces 109 (FIG. 9C). As shown in FIG. 11C, in some embodiments, an interfacial dielectric 111 is formed to wrap around and in contact with each nanostructure 54, and the gate dielectric layers 120 wrap around the interfacial dielectric 111. The interfacial dielectric 111 may be formed between the edge portions of the dummy gate dielectric layer 97 (FIG. 9D). In some embodiments, the interfacial dielectric 111 includes an oxide (e.g., silicon oxide) formed by thermal or chemical oxidation of the nanostructures 54. In some embodiments, the interfacial dielectric 111 and the dummy gate dielectric layer 97 both include silicon oxide. However, the quality of the dummy gate dielectric layer 97 is substantially lower than that of the interfacial dielectric 111, because the interfacial dielectric 111 is formed by oxidation of silicon (nanostructures 54), while the dummy gate dielectric layer 97 is formed by PEALD. The bond energy of the dummy gate dielectric layer 97 is substantially lower than that of the interfacial dielectric 111.

In some embodiments, the thickness of the interfacial dielectric 111 is substantially less than the thickness of the dummy gate dielectric layer 97, because the interfacial dielectric 111 is formed by oxidation of the nanostructures 54. For example, the ratio of the thickness of the interfacial dielectric 111 to the thickness of the dummy gate dielectric layer 97 may range from about 1 to 1.2 to about 1 to 1.5, such as 1 to 1.35. As a result, the gate dielectric layer 120 is in contact with side surfaces of the edge portions of the dummy gate dielectric layer 97, as shown in FIG. 11C.

Additional processing may be performed to finish fabrication of the NSFET device 100, as one of ordinary skill readily appreciates, thus details may not be repeated here. For example, a second ILD may be deposited over the ILD 114. Further, gate contacts and source/drain contacts may be formed through the second ILD and/or the ILD 114 to electrically couple to the gate electrode 122 and the epitaxial source/drain regions 112, respectively.

The present disclosure provides a NSFET device 100 including edge portions of the dummy gate dielectric layer 97 in contact with the epitaxial source/drain regions 112. Some embodiments may achieve advantages. For example, the by covering the epitaxial source/drain regions 112, the risk of shorting out the subsequently formed gate electrode 122 is substantially reduced.

An embodiment is a device. The device includes a semiconductor material disposed over a substrate, a first epitaxial source/drain region in contact with a first end of the semiconductor material, a second epitaxial source/drain region in contact with a second end opposite the first end of the semiconductor material, a first dummy gate dielectric layer in contact with the semiconductor material and the first epitaxial source/drain region, a second dummy gate dielectric layer in contact with the semiconductor material and the second epitaxial source/drain region, and an interfacial dielectric disposed between the first and second dummy gate dielectric layers.

Another embodiment is a device. The device includes a semiconductor material disposed over a substrate, a first epitaxial source/drain region in contact with a first end of the semiconductor material, a second epitaxial source/drain region in contact with a second end opposite the first end of the semiconductor material, a first dummy gate dielectric layer disposed on the semiconductor material, a second dummy gate dielectric layer disposed on the semiconductor material, and an interfacial dielectric disposed on the semiconductor material between the first and second dummy gate dielectric layers. A thickness of the interfacial dielectric is substantially less than a thickness of the first and second dummy gate dielectric layers.

A further embodiment is a method. The method includes forming alternating first and second semiconductor materials over a substrate, removing a portion of the first and second semiconductor materials and the substrate to form fins, depositing a dummy gate dielectric layer on the fins, depositing a dummy gate on the dummy gate dielectric layer, and forming first and second epitaxial source/drain regions on opposite sides of the dummy gate. Edge portions of the dummy gate dielectric layer are in contact with the first and second epitaxial source/drain regions. The method further includes removing the dummy gate to expose the dummy gate dielectric layer and removing a portion of the dummy gate dielectric layer. The edge portions of the dummy gate dielectric remain. The method further includes forming a gate stack over the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device, comprising:
   forming alternating first and second semiconductor materials over a substrate;
   removing a portion of the first and second semiconductor materials and the substrate to form fins;
   depositing a dummy gate dielectric layer on the fins;
   depositing a dummy gate on the dummy gate dielectric layer;
   forming first and second epitaxial source/drain regions on opposite sides of the dummy gate, wherein edge portions of the dummy gate dielectric layer are in contact with the first and second epitaxial source/drain regions;
   removing the dummy gate to expose the dummy gate dielectric layer;
   removing a portion of the dummy gate dielectric layer, wherein the edge portions of the dummy gate dielectric remain; and
   forming a gate stack over the substrate.

2. The method of claim 1, wherein the portion of the dummy gate dielectric layer is removed by a cyclic etching process.

3. The method of claim 2, wherein the cyclic etching process comprises one or more cycles of forming a reaction product and removing the reaction product.

4. The method of claim 3, wherein the one or more cycles comprise one to five cycles.

5. The method of claim 3, wherein the reaction product is formed by reacting etchants with a surface of the dummy gate dielectric layer.

6. The method of claim 5, wherein the etchants comprise HF and $NH_3$.

7. The method of claim 6, wherein the reaction product comprises ammonium fluorosilicate.

8. A method for forming a semiconductor device, comprising:
   forming a fin, wherein the fin comprises alternating first and second semiconductor materials over a substrate;
   depositing a dummy gate dielectric layer on the fin;
   depositing a dummy gate on the dummy gate dielectric layer;
   forming gate spacers on opposite sides of the dummy gate;
   removing the dummy gate to expose the dummy gate dielectric layer;
   performing a cyclic etching process to remove a portion of the dummy gate dielectric layer, wherein portions of the gate spacers are removed by the cyclic etching process, and one of the remaining gate spacers includes a slanted side surface; and
   forming a gate stack over the substrate.

9. The method of claim 8, wherein remaining portions of the dummy gate dielectric layer are disposed under the remaining gate spacers.

10. The method of claim 9, wherein a recess is formed between the remaining gate spacers and the remaining portions of the dummy gate dielectric layer.

11. The method of claim 10, wherein the recess has varying critical dimensions.

12. The method of claim 11, wherein the recess has a first critical dimension located between top portions of the remaining gate spacers, a second critical dimension located between portions of the remaining gate spacers below the top portions of the remaining gate spacers, and a third critical dimension located between the portions of the dummy gate dielectric layer.

13. The method of claim 12, wherein the first critical dimension is greater than the second critical dimension, and the second critical dimension is greater than the third critical dimension.

14. The method of claim 13, further comprising forming an interfacial dielectric between the remaining portions of the dummy gate dielectric layer.

15. The method of claim 14, wherein the interfacial dielectric and the remaining portions of the dummy gate dielectric layer comprise a same material.

16. The method of claim 15, wherein the interfacial dielectric is formed by a first process, and the dummy gate dielectric layer is formed by a second process different from the first process.

17. The method of claim 16, wherein the first process is a thermal or chemical oxidation process, and the second process is a deposition process.

18. A method for forming a semiconductor device, comprising:
- forming a fin;
- depositing a dummy gate dielectric layer on the fin;
- depositing a dummy gate on the dummy gate dielectric layer;
- forming gate spacers on opposite sides of the dummy gate;
- removing the dummy gate to expose the dummy gate dielectric layer;
- removing a portion of the dummy gate dielectric layer, wherein edge portions of the dummy gate dielectric layer are disposed under the gate spacers, and the edge portions; and
- forming an interfacial dielectric between the edge portions of the dummy gate dielectric layer, wherein the interfacial dielectric is thinner than the edge portions of the dummy gate dielectric layer.

19. The method of claim 18, wherein the dummy gate dielectric layer is deposited by a plasma enhanced atomic layer deposition process.

20. The method of claim 19, wherein the interfacial dielectric is formed by an oxidation process.

* * * * *